United States Patent [19]
Baudrand et al.

[11] Patent Number: 5,403,650
[45] Date of Patent: Apr. 4, 1995

[54] PROCESS FOR SELECTIVELY DEPOSITING A NICKEL-BORON COATING OVER A METALLURGY PATTERN ON A DIELECTRIC SUBSTRATE AND PRODUCTS PRODUCED THEREBY

[76] Inventors: Donald W. Baudrand, 867 Downing Sq., Lincolnshire, Ill. 60015; Rebecca P. Fleming, 3220 Lothian Rd., #104, Fairfax, Va. 22031; John J. Gniewek, 6025 Wendrew La., Tucson, Ariz. 85711; Joseph M. Harvilchuck, P.O. Box 186, Billings, N.Y. 12510; Arnold F. Schmeckenbecher, 228 Wilbur Blvd., Poughkeepsie, N.Y. 12603

[21] Appl. No.: 109,010

[22] Filed: Aug. 18, 1993

Related U.S. Application Data

[63] Continuation of Ser. No. 759,752, Sep. 11, 1991, abandoned, which is a continuation of Ser. No. 617,955, Nov. 26, 1990, abandoned, which is a continuation of Ser. No. 380,767, Jul. 17, 1989, abandoned, which is a continuation of Ser. No. 679,108, Dec. 7, 1984, abandoned, which is a continuation of Ser. No. 372,101, Apr. 27, 1982, abandoned.

[51] Int. Cl.$^6$ ............................................. B05D 1/00
[52] U.S. Cl. ........................................ 428/209; 427/96; 427/98; 427/304; 427/305; 428/901
[58] Field of Search .................... 427/96, 98, 304, 305; 428/209, 901

[56] References Cited

U.S. PATENT DOCUMENTS

| | | | |
|---|---|---|---|
| 3,011,920 | 12/1961 | Shipley | 106/1.11 |
| 3,045,334 | 7/1962 | Berzins | 428/648 |
| 3,062,666 | 11/1962 | McLeod | 106/1.27 |
| 3,096,182 | 7/1963 | Berzins | 427/305 X |
| 3,234,031 | 2/1966 | Zirngiebl et al. | 427/443.1 |
| 3,295,999 | 1/1967 | Klein et al. | 106/1.22 |
| 3,338,726 | 8/1967 | Berzins | 427/430 |
| 3,518,756 | 8/1967 | Bennet et al. | 29/846 |
| 3,532,541 | 10/1970 | Koretzky et al. | 427/305 X |

(List continued on next page.)

FOREIGN PATENT DOCUMENTS 2439075 3/1975 Germany.
1453174 10/1976 United Kingdom.

OTHER PUBLICATIONS

Mallory, The Electroless Nickel-Boron Plating Bath; Effects of Variables on Deposit Properties, Apr. 1971.
Baudrand, Electroless Nickel Plating on Metallized Ceramic, Sep. 1981.
IBM Technical Disclosure Bulletin, vol. 23, No. 8, Jan., 1981.
IBM Technical Disclosure Bulletin, vol. 16, No. 11, Apr. 1974.
IBM Technical Disclosure Bulletin, vol. 19, No. 10, Mar. 1977.

*Primary Examiner*—Shrive Beck
*Assistant Examiner*—Vi Duong Dang
*Attorney, Agent, or Firm*—Lockwood, Alex, FitzGibbon & Cummings

[57] ABSTRACT

A process for simultaneously selectively depositing a high purity nickel containing alloy (i.e. a nickel-boron alloy having a nickel content in excess of 99.5 percent) over a preformed metallurgy pattern (including the individual, electrically isolated contact pads and the seal band area thereon) on the top-side dielectric surface of a multi-layer ceramic module. The metallurgy pattern on such top-side surface of such module is appropriately catalyzed and then immersed in a bath which is essentially lead-free and which includes a source of nickel ions, a borane reducing agent, and an effective amount of an organic divalent sulfur compound, preferably thiodiglycollic acid. The contact pads and the seal band area so plated exhibit an exceptionally uniform layer of nickel-boron alloy, free of surface irregularities, which layer is characterized by low contact resistance, excellent wire bonding and eutectic diode bonding characteristics and is both crack-free at the time of its being deposited and remains crack-free under brazing conditions throughout the life of the component.

27 Claims, No Drawings

U.S. PATENT DOCUMENTS

| | | | |
|---|---|---|---|
| 3,540,894 | 11/1970 | McIntosh | 501/153 |
| 3,666,527 | 5/1972 | Feldstein | 427/98 X |
| 3,704,156 | 11/1972 | Foley et al. | 427/305 |
| 3,767,583 | 10/1973 | Fadgen et al. | 252/79.4 |
| 3,841,881 | 10/1974 | Feldstein et al. | 106/1.11 |
| 4,002,778 | 1/1977 | Bellis et al. | 427/98 |
| 4,048,354 | 9/1977 | Feldstein | 427/304 |
| 4,061,588 | 12/1977 | Gulla | 252/429 R |
| 4,061,802 | 12/1977 | Costello | 427/304 |
| 4,131,692 | 12/1978 | Subacher | 427/98 X |
| 4,206,254 | 6/1980 | Schmeckenbecher | 427/259 |
| 4,217,183 | 8/1980 | Melcher | 205/92 |
| 4,232,060 | 11/1980 | Mallory | 427/98 |
| 4,278,707 | 7/1981 | Biran | 427/96 |
| 4,340,618 | 7/1982 | Fury | 427/96 |
| 4,407,860 | 10/1983 | Fleming | 427/96 |
| 4,503,131 | 3/1985 | Baudrand | 427/98 |
| 4,632,857 | 12/1986 | Mallory | 428/209 |

PROCESS FOR SELECTIVELY DEPOSITING A NICKEL-BORON COATING OVER A METALLURGY PATTERN ON A DIELECTRIC SUBSTRATE AND PRODUCTS PRODUCED THEREBY

This application is a continuation of application Ser. No. 759,752, filed Sep. 11, 1991, abandoned, which is a continuation of Ser. No. 617,955, filed Nov. 26, 1990, abandoned, which is a continuation of Ser. No. 380,767, filed Jul. 17, 1989, abandoned, which is a continuation of Ser. No. 679,108, filed Dec. 7, 1984, abandoned, which is a continuation of Ser. No. 372,101, filed Apr. 27, 1982, abandoned.

BACKGROUND AND DESCRIPTION OF THE INVENTION

The present invention generally relates to a method of selectively chemically depositing nickel containing alloys over existing metallurgy patterns on a dielectric substrate, and to products produced thereby. More particularly, this invention is directed to the electroless plating of nickel-boron alloys over metallurgy patterns on ceramic substrates in high-circuit-density electronic components. In this regard, an important aspect of the present invention is specifically concerned with multi-layer ceramic modules used in semiconductor package assemblies and, particularly, with the simultaneous chemical deposition, by electroless plating procedures, of essentially crack-free, nickel-boron alloys of uniform thickness onto a plurality of discrete and electrically isolated contact pads as well as onto the seal areas which surround such contact pads, thereby providing such contact pads with improved solderability, brazability, and wire and diode bonding properties as well as providing the seal areas with improved hermetic sealing characteristics.

Multi-layer ceramic technology for producing substrates for integrated circuit semiconductor package assemblies is relatively well known in the art. These substrates are commonly produced by preparing a slurry of a suitable particulate ceramic, a resin binder material, a solvent for the resin binder, and a plasticizing agent. This slurry is typically applied by a doctor blade onto a base and then dried to form thin flexible sheets which are commonly termed ceramic green sheets.

The green sheets are then punched at predetermined locations to provide via holes and pin contact holes which are later filled with conductive material for electrically connecting the conductive patterns to be located at distinct horizontal levels within the monolithic structure which is to be ultimately produced. The conductive material, usually in a paste-like form which includes an electrically conductive component such as, for example, molybdenum-manganese, molybdenum, tungsten, molybdenum-manganese-silica or tungsten-manganese-silica together with a suitable binder, is then deposited by brushing, spraying or the like, usually using a silk screen, to form a desired circuit pattern which may include a ground plane, voltage plane and electrically isolated contact pads, some of which extend through the previously punched holes. The green sheet which is intended for the top surface of the multi-layer ceramic module will, in addition, also include a seal band strip or area that peripherally surrounds the contact pads and which is likewise coated with the conductive paste. The paste is then dried, a typical drying time and temperature being approximately ten minutes at 100° C. If desired, resistors, inductors, capacitors and other circuit components can be screened on the green sheets.

The green sheets are then stacked one upon the other, often in stacks of 15 to 30 or more sheets, with via holes in registry where desired, and the unit then subjected to moderate temperature and pressure between platens of a press for a time period which is sufficient to laminate the sheets into a monolithic body. For example, a typical lamination cycle calls for holding the stack at 175° F. and 100 psi for about five minutes and then raising the pressure to 800 psi for five minutes. This two-step operation permits any remaining volatiles to escape from between lamina and thus prevent the formation of voids. Contact or input-output pins (I/O pins), typically formed of an iron-nickel cobalt alloy can be inserted into previously metallized surfaces of the contact holes to facilitate external communication with the internal circuitry.

The resultant structure is then fired in air, at the maturing point of the ceramic module which is below the melting point of the conductive material of the conductive paste. The firing cycle can then be carried on for approximately 15 hours, the effect of which is to burn off the binder and any remaining volatile constituents, typically at the 500° to 600° C. temperature range, mature or vitrify the body, fire the screened contact pads as well as the seal band strip, and intimately bond them and the pin contacts to the ceramic material. Generally, it is desirable that the multi-layer ceramic substrate be formed with the lines in the via holes conforming to very small dimensions, such microminiaturization being desirable in order that the package be compatible with integrated circuit device chips which are to be mounted thereon. The module, therefore, must be provided on the top surface with many small pads which are closely spaced to, but electrically isolated from, each other and capable of making electrical contact with correspondingly closely spaced terminal devices. In order to more efficiently use the modern integrated circuit technology, as many as possible integrated circuit devices are supported and inter-connected within the same module. This arrangement keeps the distance between the inter-connected devices small and thereby minimizes the time it takes for electrical signals to travel from interrelated devices. In addition, this arrangement also reduces the number of electrical connections which must be made and thereby reduces the cost of the package and increases its reliability. The desirable end result being a highly complex, multi-internal ceramic package with a substantial amount of microsized internal printed circuitry contained in a relatively large module capable of mounting a large number of integrated circuit devices.

These multi-layer ceramic modules require complex metallurgy (i.e. the further application of relatively thin metallurgy layers) on the top-side to make connections to the integrated circuit devices and provide engineering change pads, and on the bottom-side to make connection to the I/O pads or other types of connections. In the past, a multi-step electrolytic/electroless deposition procedure has been employed to separately deposit a nickel layer on these contact pads and seal band strips on the top-side surface of the module. That is, the seal area has initially been coated with a nickel deposit by conventional electrolytic techniques requiring electrical connection of the seal band strip during such electroplating operation. Thereafter, a resist was applied to the thus electrolytically plated area and the surface cleaned so as to permit electroless plating of the electrically isolated contact pads with the resist thereafter being removed.

As can be appreciated, this dual plating operation not only involves a plurality of steps which result in increased cost and complexity, but also inherently increases the likelihood of potential product imperfections in the resultant assembly, producing a higher than desired product rejection rate.

The present invention overcomes these disadvantages in the heretofore practiced dual plating procedures for these multi-layer ceramic modules as well as other plating procedures wherein like problems are experienced by providing a novel process for simultaneously selectively depositing a nickel-containing alloy layer over the preformed metallurgy pattern on the top-side dielectric substrate (i.e. the plurality of individual, electrically isolated contact pads and the seal band area).

In accordance with this invention, the electrically conductive material including both the circuit components (e.g. contact pads) and the seal band area is catalyzed by treating such surface with a suitable electroless plating initiating metal, for example, by dipping the conductive material in a palladium chloride solution which, while catalyzing the individual areas which are to be chemically deposited with the nickel alloy component, also greatly assists in maintaining electrical isolation (i.e. avoids nickel deposition) between the electrically isolated contact pads. Alternatively, the conductive material can, in specialized instances, have a suitable catalyzing material (e.g. nickel metal) blended into the paste so that it is present in the deposit when initially applied to the ceramic green sheet. The thus catalyzed surfaces are then immersed in a bath which is essentially lead-free and includes a source of nickel ions, a borane reducing agent, and an effective amount of an organic divalent sulfur compound, for example, a sulfur-containing aliphatic carboxylic acid, alcohol, or derivatives thereof, preferably thiodiglycollic acid. These baths may optionally include one or more additional stabilizers, buffers, and other conventional electroless nickel bath additives.

The contact pads and seal band strip so plated exhibit an exceptionally uniform layer of nickel-boron alloy, free of surface irregularities, which is characterized by low contact resistance and excellent wire bonding and eutectic diode bonding characteristics. Furthermore, the nickel-boron surfaces are both crack-free at the time they are deposited and remain crack-free under brazing conditions and throughout the life of the component. If desired, these nickel-boron alloy layers can also be further plated with other metals, for example, noble metals such as gold.

It is, therefore, a general object of the present invention to provide a new and improved process for selectively chemically depositing a high purity nickel-containing alloy over an existing metallurgy pattern which has been previously applied to a dielectric substrate. In this regard, a further object is to provide the improved articles produced by this process.

Another object of the present invention is to provide an improved method for electrolessly plating a nickel-boron containing alloy over a metallurgy pattern on a ceramic substrate.

Another object of the present invention is to provide an improved electroless plating process for the top-side surface of multi-layer ceramic modules used in semiconductor package assemblies and to provide such improved modules as are produced by this process.

Another object of the present invention is to provide an improved, essentially crack-free, electrolessly deposited, nickel-boron coating having a boron content of 0.5 percent or less which is characterized by exceptionally uniform thickness on preformed metallurgy patterns on dielectric substrates such as, for example, ceramic substrates.

Another object of the present invention is to provide an improved electroless plating procedure which eliminates bridging between a plurality of electrically isolated, closely spaced, preformed electrical contact pads.

Another object of the present invention is to provide an improved electroless plating process, as well as to provide articles produced by such process, whereby ductile, low stress nickel-boron alloys are deposited on pre-existing metallurgy patterns which are present on a dielectric or ceramic substrate.

Another object of the present invention is to provide an improved chemical deposition procedure whereby nickel-boron layers of substantially uniform thickness are deposited onto a preformed metallurgical pattern, without experiencing irregularities in the surfaces of such deposited layers and without edge defects therein, which deposits are further characterized by being essentially crack-free at the time of the deposit, and remain so under brazing conditions as well as throughout the life of the component to which they are applied.

Another object of the present invention is to provide an improved single step chemical plating process and article produced by such process wherein a substantially uniform, crack-free, nickel containing alloy deposit is applied to individually electrically isolated contact pads as well as to a hermetic sealing area which surrounds such contact pads, which process and article are particularly suited to meet the exacting design requirements of solid state microelectronic components.

These and other objects of the present invention will be apparent from the following description of a preferred embodiment thereof.

In general, the chemical deposition or electroless plating aspects of the present invention are particularly suited for depositing a nickel-boron alloy onto a nonconductor or dielectric substrate surface. These procedures, however, under appropriate conditions can also be utilized in the electroless deposition of nickel alloys onto metallic substrates as well. The deposits obtained on both dielectric and metallic substrates are characterized by a high-purity coating which is hard, wear-resistant, and easily soldered or brazed. Furthermore, the electroless plating aspects of this invention also find advantageous utility in both rack and barrel plating operations.

Accordingly, while the present invention has broad application to a wide variety of plating operations, it finds particularly advantageous utility in the manufacture of multi-layer ceramic modules of the type generally described above. The following description of a preferred embodiment specifically concentrates on those aspects of these manufacturing procedures which are relevant to the present invention.

Following sintering, the top-side surface of the module is cleaned to remove any contaminants thereon, typically by a trichloroethylene vapor degreasing step or other suitable alkaline cleaning operation. That surface is then treated to remove traces of the conductive paste (for example, the molybdenum-manganese or equivalent conductive material deposit) from the ceramic surface in the areas between the individual circuit elements. While this step can be accomplished in a number of different ways apparent to those skilled in the art, one suitable procedure involves the application to such surface of a solution of potassium ferricyanide and potassium hydroxide, typically in a ratio of two parts of potassium ferricyanide for each part of potassium hydroxide. This step not only functions to remove traces of the conductive material which could provide for short circuiting between the electrical contact pads, but also serves to activate the surface of such contact pads for subsequent plating. Typically, the surface is immersed in such solution for a period of from about 30 to about 50 seconds at room temperature. The surface is then rinsed to remove all traces of the alkaline solution, usually a one minute rinse with deionized water is sufficient.

Thereafter, traces of glass from the conductive paste deposits are removed by immersion of the top-side surface in a hot caustic solution such as a solution of 100 grams per liter of potassium hydroxide at 100° C. for a period of from 10 to 15 minutes. If this treatment time is not of sufficient duration, the amount of metal which is exposed may be insufficient for satisfactory plating adhesion. On the other hand, if treatment time is longer than necessary, a weakened plating bond may result. Thereafter, residual quantities of the potassium hydroxide are removed by suitable rinsing such as, for example, with deionized water.

Surface preparation is then preferably followed by dipping the top-side surface to be ultimately plated in an acid solution such as, for example, a hydrochloric acid solution having a concentration of from 10 to 50 percent by weight, preferably 10 percent by weight, for a period of from 6 to 10 seconds to remove any metal oxides. Any residual hydrochloric acid remaining is removed by rinsing, again with deionized water or other suitable washing agent.

The thus prepared metallurgy pattern defined by the conductive paste is now ready to be catalyzed, that is, to make such surface receptive to accept the reduction of nickel ions in the form of nickel-boron alloys by the boron containing reducing agent in the electroless bath of the chemical plating step and to accept such deposits as a uniform layer on these surfaces. In this regard, it will be appreciated that many suitable catalyzing agents will be apparent to those skilled in this art including, in particular, both precious and non-precious metal catalyzing agents such as are described in U.S. Pat. No. 3,011,920, entitled "Method of Electroless Deposition on a Substrate and Catalyst Solution Therefor," U.S. Pat. No. 3,767,583, entitled "Activator Solutions, Their Preparation and Use in Electroless Plating of Surfaces," U.S. Pat. No. 3,841,881, entitled "Method for Electroless Deposition of Metal Using Improved Colloidal Catalyzing Solution," U.S. Pat. No. 4,048,354, entitled "Method of Preparation and Use of Novel Electroless Plating Catalysts," and U.S. Pat. No. 4,061,588, entitled "Catalyst Composition and Method of Preparation," the disclosures of all such patents being incorporated herein by reference. In general, these patents describe various catalytic systems, including colloidal solutions which function to catalyze a surface so that it is receptive to deposition thereon of the nickel-boron alloy from the electroless plating step which is to follow. Suitable catalyst systems include those colloidal systems which include cobalt, nickel, copper, palladium and silver as well as solutions resulting from the admixture of an acid-soluble salt with a catalytic metal such as gold or platinum together with hydrochloric acid, a soluble stannous salt which is present in excess of the amount necessary to reduce the metal salt to colloidal metal, and a quantity of stannic chloride. A preferred catalyzing agent is palladium chloride which typically can be employed in an aqueous solution of from 0.01 to 0.1 percent palladium chloride which also contains one milliliter per liter of concentrated hydrochloric acid. The surface to be so catalyzed is dipped in the palladium chloride solution at room temperature for approximately 30 seconds. In order to minimize the effect of an immersion deposit, it is generally preferred that the lowest concentration of palladium that will provide an active catalytic surface be employed. An actual optimum concentration of palladium chloride will, therefore, vary in accordance with the condition of the metallization in the particular application.

One particularly advantageous benefit obtained with such a palladium chloride solution is that it becomes absorbed on the conductive paste and is reduced thereon to palladium metal, a strong catalyst, while the palladium chloride which comes into contact with the dielectric or ceramic surface and may be present after rinsing, remains as palladium chloride, a relatively weak catalyst. Accordingly, during subsequent plating there is a greater tendency for the nickel-boron alloy to be deposited onto the contact pads and seal band area and to thereby assure electrical isolation between the individual contact pads.

While a separate catalyzation step can be employed as described above, it is also possible in appropriate circumstances to render the conductive paste surface active and catalytic by the incorporation therein of a suitable catalyzing agent prior to its being deposited on the substrate. For example, the addition of from 1 to 3 or more percent nickel metal or other catalyzing agent to the conductive paste (i.e. the manganese-molybdenum, molybdenum or tungsten paste) will generally be sufficient to render the metallurgy pattern on the top-side surface of the module sufficiently catalytic so as to eliminate any need for a separate catalyzing step.

Following catalyzation, the surfaces so treated are rinsed and the surfaces to be plated are now ready for bath immersion. In this regard, it is important to note that a feature of the present invention is that the electroless plating bath be essentially lead-free. Accordingly, while it has commonly been accepted in the past that the use of lead stabilizers such as, for example, lead acetate, provided advantageous deposition-enhancement characteristics to the bath, the electroless plating baths which are utilized in accordance with an important aspect of the present invention preferably are essentially lead-free, containing no lead salts or alternatively lead levels below 2 ppm and preferably below 1 ppm. These very low level lead concentrations in combination with the relatively high levels of organic divalent sulfur stabilizer, as will be more fully described hereinafter, cooperate to provide nickel-boron deposits of exceptionally uniform thickness on the contact pads and seal band area which deposits are also free of other surface imperfections which would render such thus deposited nickel-boron layers otherwise generally unsuitable for meeting the exacting and high design requirements of solid state microelectronic components.

The lead-free or essentially lead-free electroless baths which are used in accordance with an important aspect of the present invention generally include a suitable nickel source, a borane reducing agent, an effective amount of an organic divalent sulfur compound which primarily functions as a bath stabilizer and, optionally, one or more additional stabilizers, buffers, buffering systems as well as wetting agents and other conventional bath ingredients.

The source of nickel cations for these nickel-boron baths can be any of the water soluble or semi-soluble salts of nickel which are conventionally employed for such plating and which preferably are free of any lead contaminants. Suitable metal salts which can serve as sources of the nickel cations may, for example, include nickel acetate, nickel chloride, nickel sulfamate, nickel sulfate as well as other salts of nickel and other anions which are compatible with electroless nickel systems. For example, with appropriate adjustment of the complexes, nickel glycolate as well as other nickel organic compounds can be used as the source of nickel ions in the bath. Of these metal salts, nickel sulfamate is preferred. Nickel concentrations utilized in these baths are those which are typical for electroless nickel plating baths and will generally range from about 0.001 mol per liter of bath to about 0.5 mol per liter.

The borane reducing agents utilized in these nickel-boron depositing baths include any bath soluble borane source such as the amine boranes, lower alkyl substituted amine boranes, and nitrogen-inclusive heterocyclic boranes including pyridine borane and morpholine borane. These compounds are typically characterized by their inclusion of a $BH_3$ group. The alkyl amine boranes are preferred, with dimethylamine borane being a particularly preferred reducing agent. Generally, the reducing agent concentration used in these baths is such as to effect adequate reduction of the nickel cations within the bath under the operating conditions being employed. For example, in instances wherein a catalyzing agent is directly admixed into the conductive paste prior to application to the green sheet, high concentrations of reducing agent will be required. A typical minimum concentration for the reducing agent can be as low as about 0.002 mol per liter of bath, more usually however, higher concentrations in the order of from 0.01 to about 0.1 mol per liter will be employed with approximately 0.04 mol per liter being preferred for most operations. In instances wherein dimethylamine borane is used, bath concentrations thereof of from 1 to 5 grams per liter are generally satisfactory with a concentration of approximately 2.0 to 2.5 grams per liter being preferred.

These nickel-boron plating baths in accordance with an important aspect of the present invention include an organic divalent sulfur compound which is soluble in the bath and wherein each of the two valences of the sulfur atom are directly linked with a carbon atom as a bath stabilizer. Examples of suitable organic divalent sulfur compounds which are used in accordance with the present invention are the sulfur-containing aliphatic carboxylic acids, alcohols and their derivatives, the sulfur-containing aromatic/aliphatic carboxylic acids, the sulfur-containing acetylene compounds, the aromatic sulfides, the thiophenes and thionaphthenes, the thiazoles, and thiourea. Illustrative examples of these organic sulfur compounds are shown and described in U.S. Pat. No. 3,234,031, the disclosure of which is incorporated herein by reference. Thiodiglycollic acid is a particularly preferred stabilizing agent for these nickel-boron baths. The concentration of these sulfur-containing stabilizers will typically depend upon the particular stabilizer being employed and other bath conditions. Accordingly, effective amounts of such stabilizers can be described as those amounts which will effect the desired stability to the bath while at the same time enabling reduction of the nickel-boron deposition onto the surfaces to be plated therein at the desired rate which will provide for, and enable, the obtaining of a nickel-boron deposit of substantially uniform thickness, which is essentially free of irregularities in the surface, without edge defects therein, and which is also further characterized by being essentially crack-free. Concentrations of these sulfur-containing stabilizers will generally range from approximately 0.5 to 5 mols per liter. In instances wherein the preferred thiodiglycollic acid stabilizer is utilized, it has been found that concentrations of such stabilizer in the bath of from approximately 25 to approximately 700 ppm can be utilized. Higher concentrations of such thiodiglycollic acid tend to substantially reduce the rate of deposition of the nickel-boron and, accordingly, concentrations of approximately 50 to approximately 350 ppm of thiodiglycollic acid are preferred for most applications.

The nickel-boron baths of the present invention can employ a wide variety of complexing agents, depending upon considerations such as availability, economics, and properties desired for the particular bath. Typically, bath soluble carboxylic acids and bath soluble derivatives thereof, including hydroxy-substituted carboxylic acids, substituted carboxylic acids, and bath soluble derivatives thereof including their anhydrides, salts or esters that are likewise bath soluble can be utilized. Complexing agents which are suitable can also include ammonia and other organic complex-forming agents containing one or more of the following functional groups: primary amino groups, secondary amino groups, tertiary amino groups, imino groups, carboxy groups, and hydroxy groups. In this regard, preferred complexing agents include ethylenediamine, diethylenetriamine, triethylenetetramine, ethylenediaminetetracetic acid, citric acid, tartaric acid, lactic acid and water soluble salts thereof. Related polyamines and N-carboxymethyl derivatives thereof may also be used.

The complexing agent bath concentrations will normally be dependent upon the particular complexing agent or agents which are being used within the bath as well as operating conditions within the bath. Generally speaking, the complexing agents will be present in the nickel-boron baths of the present invention at a concentration of at least about 0.005 mol per liter, while concentrations as high as bath solubility limits and economic considerations dictate, usually no higher than about 1.5 mol per liter can be utilized, a typical concentration range for the complexing agent being between about 0.005 and about 1 mol per liter of bath, preferably being between about 0.1 and 0.7 mol per liter.

Buffers and buffering systems are typically included within the nickel-boron baths of the present invention. In this regard, buffering agents must be those which are not antagonistic to the plating system. Both acidic and alkaline buffering systems are generally operative including the common carboxylic acids such as acetic, propionic, and the like. Typically, the bath may be buffered by adding a weak acid and adjusting the pH with a base, or both a weak acid and its salt may be added in the desired amounts. Another procedure which can be followed is to add the salt of a weak acid and a strong acid. This method, however, is not preferred inasmuch as the acid anion and salt cation will be present in solution. Typically, the amount of buffering agent or the buffering system which is present in these electroless nickel baths will vary depending upon conditions. A total concentration thereof of at least approximately 0.005 mol per liter is generally suitable. The concentration of such buffering agent or system, however, will vary in accordance with the needs for maintaining pH control and usually will not exceed approximately 0.4 mol per liter.

Suitable operating conditions for the nickel-boron baths of the present invention will generally range from approximately 50° to 75° C., with the temperature of approximately 65° C. being commonly used in both barrel and rack plating operations. However, temperatures above or below these specific temperatures can be used to obtain acceptable nickel-boron deposits on preformed metallury patterns on dielectric substrate surfaces. Correspondingly, pH ranges for these baths will generally range from approximately 4.5 to approximately 7.5 with a pH of approximately 6.5 generally being preferred for most plating operations.

The nickel-boron alloy deposits which are achieved with the practice of the present invention can be characterized as high-purity nickel alloy deposits, that is, alloy deposits wherein the nickel concentration is at least 99.5 percent by weight with the remainder of the deposit being boron and being essentially free of other metals or contaminants. In this regard, it has been found that the boron content is primarily controlled by the concentration of the organic divalent sulfur compound stabilizer which is present in the bath and that in lead-free baths using the preferred thiodiglycollic acid in the preferred concentration, nickel-boron alloys having boron contents of from 0.1 to 0.2 percent will be readily obtained.

While the thickness of the nickel-boron deposit on the contact pads and seal band area will, to a great extent, be dependent upon whether subsequent processing (for example, further plating) will be performed thereon, typical nickel-boron alloy deposits of from approximately 0.5 to 7.5 microns will be commonly employed with deposit thicknesses of from 2.5 to 5.0 microns generally being preferred.

The following example illustrates a preferred embodiment of the method of the present invention.

EXAMPLE

A multi-layer ceramic module was fabricated utilizing an alumina ceramic material as previously described. The top-side included contact pads and a seal band area of a molybdenum conductive material which were formed by screen printing a molybdenum and organic vehicle paste mixture on the surface of the green ceramic substrate prior to sintering. Upon sintering, the vehicle in the paste was burned off along with the binder resin in the substrate. The thickness of the molybdenum pads and seal band area was 5 microns measured from the top surface of the substrate. The sintered substrate was initially degreased with a vapor blast of trichloroethylene and then dipped for 45 seconds in an aqueous solution of 215 grams per liter of $K_2Fe(CN)_6$ and 75 grams per liter of KOH. The surface was then rinsed for one minute with deionized water and immersed in a hot potassium hydroxide solution having a concentration of 100 grams of potassium hydroxide per liter. This step was followed by a thorough rinsing with deionized water and the surface then dipped in a 10 percent hydrochloric acid solution for 10 seconds followed by a thorough rinsing, again with deionized water. This surface was then catalyzed by dipping for 30 seconds in a solution of 0.05 percent palladium chloride solution containing one milliliter per liter of concentrated hydrochloric acid at room temperature. The surface was then rinsed with deionized water and immersed in an electroless plating bath as follows:

| | |
|---|---|
| Nickel ions | 10.5 g/l |
| Sodium citrate | 24 g/l |
| Lactic acid | 25 g/l |
| Thiodigylcollic acid | 0.17 g/l |
| Wetting agent | 0.012 g/l |
| Dimethylamine borane | 2.8 g/l |
| pH | 6.5 |
| Bath temperature | 65° C. |

The plating was continued for approximately 45 minutes until a nickel-boron deposit of approximately 5.0 microns in thickness having a boron content of 0.1 weight percent was obtained. The substrate so plated was then washed and observed to have a substantially uniform thickness over each of the contact pads and the seal bank area which deposits were observed to be crack-free and without any edge defects. Moreover, the individual contact pads were completely electrically isolated from each other and readily able to be joined by soldering or brazing to electrical component leads.

While the foregoing specification sets forth various embodiments of the present invention in detail, it will be appreciated that modifications thereto may be made without departing from the spirit and scope thereof. Accordingly, only such limitations are to be imposed on this invention as are indicated in the appended claims.

We claim:

1. A process for chemically and electrolessly selectively depositing a high-purity nickel, nickel-boron alloy as a uniform and essentially crack-free layer over an existing metallurgy pattern on the top side surface of a dielectric ceramic substrate in an integrated circuit semiconductor assembly, which metallurgy pattern includes a plurality of individual, electrically isolated contact pads and an elongate strip peripherally located With respect to and separate from said contact pads, said process comprising: depositing a conductive paste onto said dielectric ceramic substrate in a preformed pattern to define a plurality of discrete contact pads thereon and an elongate strip separate from said contact pads, said conductive paste including an electrically conductive metal component; treating said thus applied conductive paste to expose the electrically conductive metal component thereof; contacting the electrically conductive metal deposits with a solution containing a catalyzing agent which includes a metal which catalyzes the plating of said nickel-boron alloy so as to avoid nickel deposition between the electrically isolated contact pads; and simultaneously chemically plating said discrete contact pads and said elongate strip in a single step plating process, said single step plating process including simultaneously immersing said discrete contact pads and said continuous peripheral strip in an aqueous bath that is essentially lead-free and includes a source of nickel-boron ions, a boron compound and an effective amount of an organic divalent sulfur compound which stabilizes said bath.

2. The process of claim 1 wherein said conductive paste includes a metal selected from the group consisting of molybdenum, manganese, tungsten and mixtures thereof.

3. The process of claim 1 wherein said conductive paste includes molybdenum.

4. The process of claim 1 wherein said catalyzing agent is palladium chloride.

5. The process of claim 4 wherein said palladium chloride is present in an aqueous solution in an amount of from 0.05 to 0.1 grams per liter.

6. The process of claim 1 wherein said bath has a lead content of less than 2 ppm.

7. The process of claim 1 wherein said aqueous bath has a lead content of less than 1 ppm.

8. The process of claim 1 wherein said source of nickel ions in said aqueous bath is selected from the group consisting of nickel acetate, nickel chloride, nickel sulfamate and nickel sulfate.

9. The process of claim 8 wherein said source of nickel ions is lead-free.

10. The process of claim 1 wherein said boron compound is a borane reducing agent.

11. The process of claim 10 wherein said borane reducing agent is present in said bath in a concentration of from 0.002 to 0.1 mol per liter.

12. The process of claim 10 wherein said borane compound is present in a concentration of approximately 0.04 mol per liter.

13. The process of claim 10 wherein said borane reducing agent is a lower alkyl substituted amine borane.

14. The process of claim 10 wherein said borane reducing agent is dimethylamine borane.

15. The process of claim 14 wherein said dimethylamine borane is present in said bath in an amount of from 1 to 5 grams per liter.

16. The process of claim 14 wherein said dimethylamine borane is present in said bath in an amount of from approximately 2.0 to 2.5 grams per liter.

17. The process of claim 1 wherein said organic divalent sulfur compound is selected from the group consisting of sulfur-containing aliphatic carboxylic acids, alcohols and their derivatives, sulfur-containing aromatic/aliphatic carboxylic acids, sulfur-containing acetylene compounds, aromatic sulfides, thiophenes, thionaphthenes, thiazoles, and thiourea.

18. The process of claim 17 wherein said organic divalent sulfur compound is present in said bath in an amount of from 0.5 to 5 mols per liter.

19. The process of claim 1 wherein said organic divalent sulfur compound is thiodiglycollic acid.

20. The process of claim 19 wherein said thiodiglycollic acid is present in said bath in an amount of from 50 to 350 ppm.

21. The process of claim 1 wherein the temperature of said bath is from approximately 50 to approximately 75° C.

22. The process of claim 1 wherein said bath has a pH of from approximately 4.5 to approximately 7.5.

23. In a multi-layer ceramic module for use in an integrated circuit semiconductor assembly, said module including a dielectric ceramic substrate surface which includes a plurality of discrete electrically-conductive contact pads and an elongate strip of electrically-conductive material peripherally located with respect to and separate from said contact pads, the improvement comprising a uniformly thick homogeneous, essentially crack-free, essentially lead-free electrolessly plated, nickel-boron deposit both on said contact pads and on said elongate strip, said nickel-boron deposit having been simultaneously, chemically and electrolessly plated on said contact pads by the plating process of claim 1 and, said nickel-boron deposit further being characterized by a nickel content in excess of 99.5% and a thickness of less than 7.5 microns.

24. The multi-layer ceramic module of claim 23 wherein said deposit has a boron content of up to 0.5 percent.

25. The multi-layer ceramic module of claim 23 wherein said deposit has a boron content of up to 0.2 percent.

26. The multi-layer ceramic module of claim 23 wherein said deposit has a thickness of from 0.5 to 7.5 microns.

27. The multi-layer ceramic module of claim 23 wherein said deposit has a thickness of from 2.5 to 5.0 microns.

* * * * *